United States Patent
Chang et al.

(10) Patent No.: US 7,826,251 B2
(45) Date of Patent: Nov. 2, 2010

(54) HIGH PERFORMANCE METAL GATE POLYGATE 8 TRANSISTOR SRAM CELL WITH REDUCED VARIABILITY

(75) Inventors: Leland Chang, New York, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 12/125,637

(22) Filed: May 22, 2008

(65) Prior Publication Data

US 2009/0290439 A1  Nov. 26, 2009

(51) Int. Cl.
*G11C 11/00* (2006.01)
(52) U.S. Cl. .............. 365/154; 365/63; 365/230.05; 257/202; 257/204; 257/903
(58) Field of Classification Search .......... 365/154, 365/188, 230.05, 63, 72; 257/202, 204, 903
See application file for complete search history.

(56) References Cited

U.S. PATENT DOCUMENTS

| | | | |
|---|---|---|---|
| 6,140,688 A | 10/2000 | Gardner | |
| 6,303,418 B1 | 10/2001 | Cha | |
| 6,477,080 B2 | 11/2002 | Noble | |
| 6,777,761 B2 | 8/2004 | Clevenger | |
| 7,106,620 B2 * | 9/2006 | Chang et al. | 365/154 |
| 7,233,032 B2 * | 6/2007 | Liaw | 257/202 |
| 7,376,002 B2 * | 5/2008 | Nii | 365/154 |
| 7,440,356 B2 * | 10/2008 | Venkatraman et al. | 365/230.05 |
| 2005/0233530 A1 | 10/2005 | Barnak | |
| 2007/0242513 A1 | 10/2007 | Chang | |

* cited by examiner

*Primary Examiner*—Tuan T. Nguyen
*Assistant Examiner*—Toan Le
(74) *Attorney, Agent, or Firm*—Micheal J. Buchenhorner; Vazken Alexanian (57) ABSTRACT

A static random access memory cell includes a metal hi-k layer; a poly-SiON gate stack over the metal hi-k layer; a plurality of inverters disposed within the poly-SiON gate stack; and a plurality of field effect transistors placed in the metal hi-k layer.

13 Claims, 7 Drawing Sheets

HIGH PERFORMANCE METAL GATE POLYGATE 8 TRANSISTOR SRAM CELL WITH REDUCED VARIABILITY

CROSS-REFERENCE TO RELATED APPLICATIONS

None.

STATEMENT REGARDING FEDERALLY SPONSORED-RESEARCH OR DEVELOPMENT

None.

INCORPORATION BY REFERENCE OF MATERIAL SUBMITTED ON A COMPACT DISC

None.

FIELD OF THE INVENTION

The invention disclosed broadly relates to the field of microelectronics and more particularly relates to the field of static random access memories.

BACKGROUND OF THE INVENTION

As CMOS (complementary metal-oxide semiconductor) technologies are scaled, SRAM stability becomes a major concern. It is apparent that scaling of six transistor (6-T) SRAM cells will not be able to keep up with overall technology scaling. Stability problems arise whenever the stored voltages on the internal nodes are disturbed. In 6-T cells, this occurs when the pass-gate connected to an internal node with a stored '0' is activated with a '1' on the bit line. This pulls the internal node above ground, which could unintentionally flip the cell. Two scenarios result in such a situation in a given cell: during a read event and during a write to a neighboring cell with a common word line (column/bit select).

Figure 1:
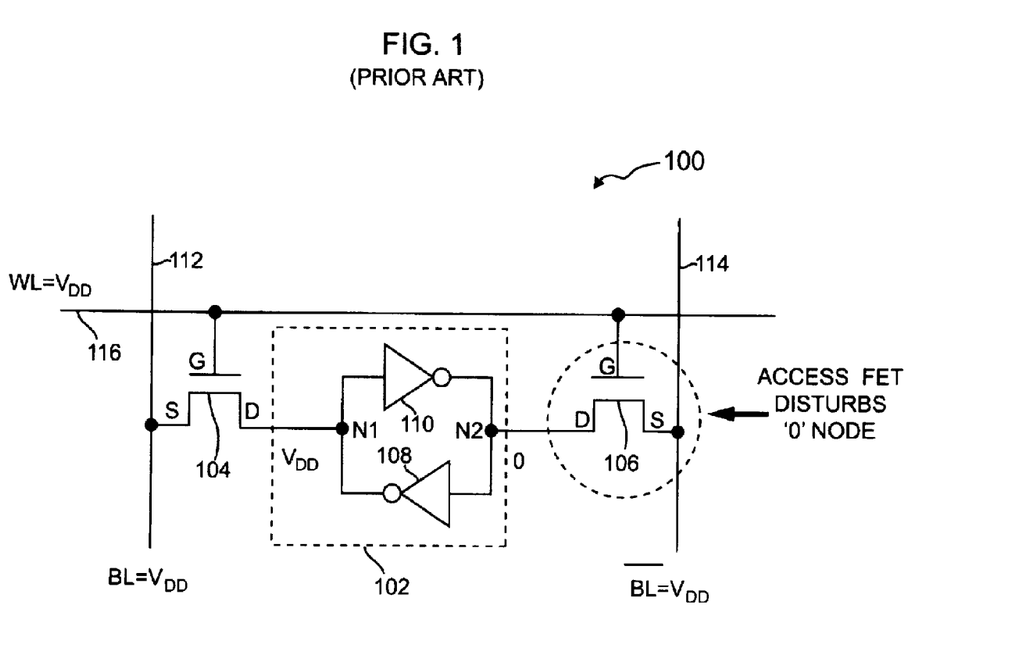
FIG. 1 is a simplified illustration of a modified 8-T SRAM cell circuit diagram, according to the known art.

FIG. 1 is a schematic diagram illustrating a six transistor (6-T) memory cell 100 known in the art. This cell 100 is particularly well-suited for use in an SRAM array. The memory cell 100 includes a static storage element 102 which is connectable to first and second write bit lines (WBL) 104 and 106 via first and second write access circuits 128 and 130, respectively. Write access circuits 128 and 130 include access transistors 114 and 116, respectively, although alternative connection circuitry can also be used.

Gate terminals of access transistors 114 and 116 are connected to a corresponding write word line (WWL) 110 for conveying a write signal. The access transistors 114 and 116 function together to connect the storage element 102 to the write bit lines (WBL) 104 and 106 in response to a write signal. The first and second write access circuits 128 and 130 may be implemented as a single write circuit.

As technologies scale, process-induced variations, as well as fundamental variation sources such as the dopant fluctuation effect on Vt (voltage threshold) result in large threshold voltage variations across a wafer.

This Vt scatter magnifies the disturb voltage in 6-T cells, which leads to stability fails in SRAM arrays. The scaling of power supply voltages further degrades stability. Existing solutions involve subtle modifications to the 6-T cell itself such as transistor sizing, threshold voltage design, increasing cell size; or the array, such as a higher static random access memory (SRAM) array power supply voltage (Vdd) to increase the stability margin. These techniques may not be sufficient in future technologies.

Therefore, there is a need for a method to improve SRAM stability as CMOS technologies are scaled.

SUMMARY OF THE INVENTION

Briefly, an embodiment of the invention improves on the prior art SRAM cells by using a pair of inverters comprising SiON FET transistors and all other FETs used in the cell using high-k metal.

BRIEF DESCRIPTION OF THE DRAWINGS

To describe the foregoing and other exemplary purposes, aspects, and advantages, we use the following detailed description of an exemplary embodiment of the invention with reference to the drawings, in which.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

According to an embodiment of the invention, a hybrid metal Hi-k/poly-SiON gate 8-transistor SRAM cell and its implementation (layout and architecture) completely eliminates disturbs during a read event by altering the read mechanism of the cell. Hi-k is a metal gate silicon technology. The hybrid implementation improves upon the known art by placing the inverters in the 8-T cell in a poly-SiON gate stack and placing the rest of the FETs in metal Hi-k. The lower $T_{inv}$ of the metal Hi-k FETs reduce the overall cell variability from doping and the poly-SiON FETs in the inverter will improve cell performance by lowering the write current needed as well as lowering the capacitive load.

Using poly-SiON to lower the drive currents in the inverters permits far greater differential drive currents than can be accomplished with simple $V_t$ adjustments and eliminates the variability that comes from higher doping levels. The inverters are placed in the poly-SiON gate stack and the rest in the FETs in the metal Hi-K.

Figure 2:
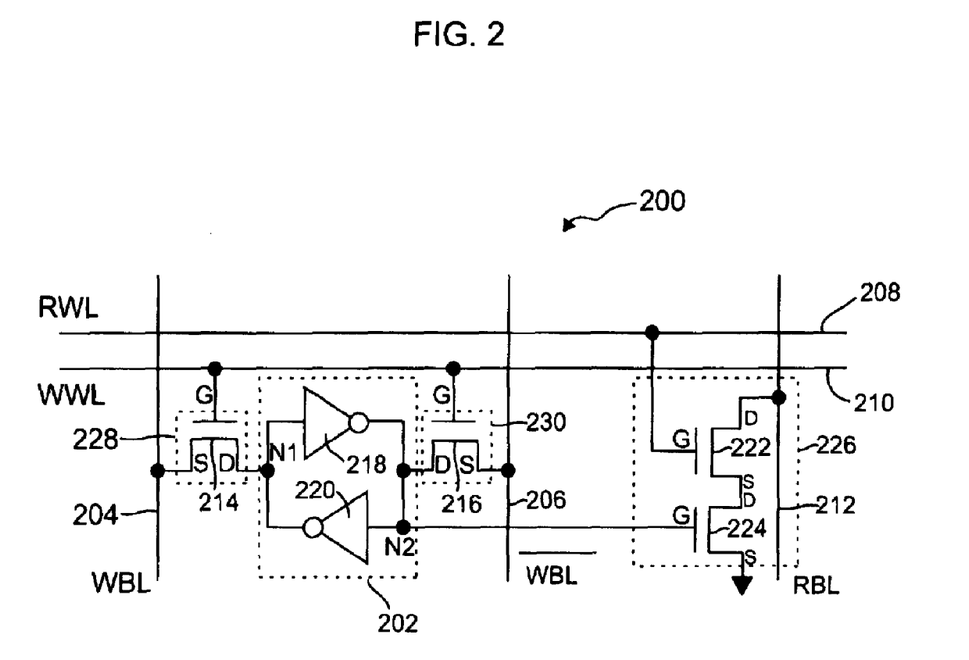
FIG. 2 shows a standard 6-T SRAM cell layout, according to the known art.

While the four-transistor storage element arrangement 200 depicted in FIG. 2 provides a substantially compact circuit structure, alternative circuit configurations for implementing the static storage element 202 are similarly contemplated, as will be understood by those skilled in the art. According to an embodiment of the invention, the FETs 218, 220 in the inverters are placed in a SiON gate stack. Furthermore, the techniques of the invention described herein are not limited to the specific memory cell circuit arrangement shown.

The circuit arrangement, including first and second access transistors 214, 216 and the static storage element 202 may appear similar to some 6-T memory cell configurations, except that write bit lines (WBL) 204 and 206 in memory cell 200 are substituted for the bit lines 112 and 114, respectively, in memory cell 100, and write word line (WWL) 210 in memory cell 200 is substituted for the word line 116 in memory cell 100. It is to be appreciated that, during a write operation of memory cell 200, the basic operation of the memory cell is essentially the same as compared to writing a standard 6-T memory cell. Specifically, the access transistors 214, 216 are enabled by an active write signal on the write word line (WWL) 210, and the write bit lines (WBL) 204 and 206 may be used to write the logical state of the memory cell as in a conventional manner. Accordingly, the techniques of the present invention are directed primarily to the read operation of the memory cell 200, as will be described in further detail herein below.

In order to eliminate disturbs of the memory cell 200 during the read operation, the memory cell is preferably configured so as to electrically isolate the static storage element 202 from any of the bit lines or word lines in the memory array in which the memory cell 200 may be employed. To accomplish this, the exemplary memory cell 200 includes a separate read circuit 226 connected to a corresponding read bit line (RBL) 212 and read word line (RWL) 208 for selectively activating the read circuit.

It is to be appreciated that, in accordance with an alternative embodiment of the invention, the read bit line (RBL) 212 may be connected together with a write bit line (WBL) 206. Although possibly producing a negative impact on the speed of the memory cell to some extent, this arrangement could beneficially reduce the number of bit lines required in the memory array.

According to an embodiment of the invention the read circuit 226 comprises first and second metal Hi-k dielectric transistors 222 and 224, respectively, connected in a stacked arrangement. Specifically, a drain terminal of first transistor 222 is connected to the read bit line (RBL) 212, a source terminal of the first transistor is connected to a drain terminal of the second transistor 224, and a source terminal of transistor 224 is connected to ground, or an alternative reference source.

A gate terminal of transistor 222 is connected to the read word line (RWL) 208 and forms a first input of the read circuit 226, and a gate terminal of transistor 224 is connected to internal node N2 of the storage element 202 and forms a second input of the read circuit.

In accordance with an embodiment of the invention, the read circuit 226 is configured such that a substantially low resistance (e.g., about tens of ohms) electrical path is formed between the drain terminal of the first transistor 222 and the source terminal of the second transistor 224 when both the first and second inputs of the read circuit are enabled (e.g., Vdd). It is to be understood that alternative read circuitry may be similarly employed in the memory cell 200, as may become apparent to those skilled in the art.

When reading memory cell 200, an active read signal (e.g., Vdd) is applied to the corresponding read word line (RWL) 208, thereby turning on transistor 222 in the read circuit 226. When a logical "1" is stored at node N2, transistor 224 in the read circuit 226 is turned on, thereby creating an electrical path and allowing current to flow, when the corresponding read bit line (RBL) 212 is raised above ground potential, between the read bit line (RBL) and ground through transistors 222 and 224.

Likewise, when a logical "0" is stored at node N2, transistor 224 is turned off and thus the electrical path between read bit line (RBL) 212 and ground is effectively broken, thereby preventing current from flowing between the read bit line (RBL) 212 and ground.

A sense amplifier, or alternative sensing circuitry, connected to the read bit line (RBL) 212 is preferably operative to detect a voltage and/or current difference on the read bit line (RBL) 212 and to equate this difference with the logical state of the memory cell 200.

During the read operation, access transistors 214 and 216, which are enabled during the write operation, are disabled, such as, for example, by applying a logical "0" to the corresponding write word line (WWL) 210. Disabling transistors 214 and 216 during the read operation serves to electrically isolate the static storage element 202 from the corresponding write bit lines (WBL) 204 and 206. Moreover, since the gate terminal of transistor 224, which is connected to node N2 of the storage element 202, has a substantially high impedance associated therewith (e.g., greater than one mega-ohm), the internal node N2 is essentially electrically isolated from the read bit line (RBL) 212 during both the read and write operations.

When configured in accordance with the present invention, the exemplary memory cell 200 provides a mechanism for reading the memory cell which is beneficially decoupled from the mechanism used to write the memory cell. This memory cell arrangement also allows for dual-port operation, wherein simultaneous read and write operations can be performed in different cells of the memory array.

During a read operation, a sense amplifier is generally connected to a bit line corresponding to the memory cell(s) being read. In the case of the standard 6-T memory cell 100 depicted in FIG. 1, which utilizes both bit lines 112, 114, a differential (e.g., double-ended) sense amplifier is required. Differential sense amplifiers, which rely heavily on symmetry, are highly sensitive to IC process variations, such as, for example, Vt (threshold voltage) mismatch, and therefore must be carefully designed so as to minimize the effects of such variations.

Consequently, differential sense amplifiers generally require a more complex and robust circuit architecture. In contrast, the exemplary 8-T memory cell 200 shown in FIG. 2 is capable of utilizing a single read bit line (RBL) 212 during the read operation, and therefore may be used in conjunction with a single-ended sense amplifier. Single-ended sense amplifiers are favored since they are typically less complex in circuit topology and are more tolerant of integrated circuit process variations compared to differential sense amplifiers.

There are at least two interrelated issues affecting the stability of a memory cell; namely, read stability and noise margins. Intuitively, read stability relates to how likely it is to invert (e.g., disturb) the memory cell's stored value when accessing the cell during a read operation. Read stability is the primary issue affecting the overall stability of the memory cell.

The static noise margin (SNM) of a memory cell may be defined as the minimum direct current (DC) noise voltage necessary to flip the logical state of the memory cell, particularly during a standby mode of operation of the memory cell. Static noise margin may be more easily visualized by creating a "butterfly curve" corresponding to a given memory cell. Butterfly curves can be generated by plotting transfer characteristics of the memory cell over variations in process, voltage and/or temperature (PVT) conditions associated with the memory cell. By way of example, a Monte Carlo analysis can be performed to obtain a distribution for the static noise margin of the memory cell.

Figure 3A:
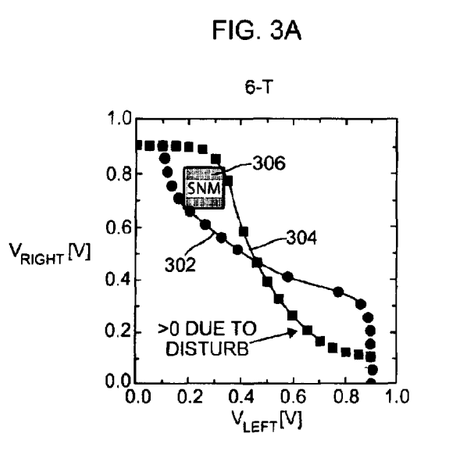
FIG. 3 shows an 8-T SRAM cell layout, indicating the placement of the inverters, according to an embodiment of the present invention.
Figure 3B:
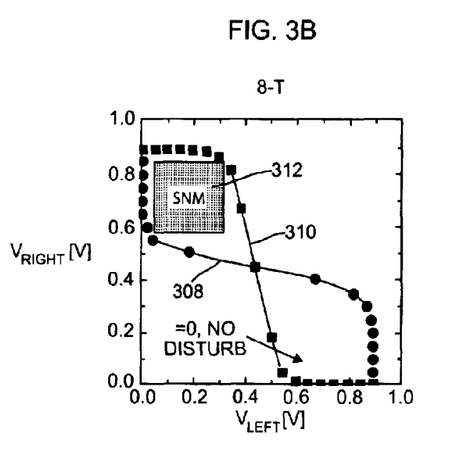

FIGS. 3A and 3B are exemplary graphical representations depicting static noise margin for the 6-T memory cell 100 shown in FIG. 1 and for the 8-T memory cell 200 shown in FIG. 2, respectively. As shown in FIG. 3A, the exemplary butterfly curve for the 6-T memory cell 100 shows two curves 302 and 304, representing the transfer characteristics of the two inverters 108, 110 (see FIG. 1) overlaid on top of one another under worst case stability conditions.

Stability Improvement. The cell stability improvement in this 8-T SRAM is illustrated by the "butterfly curves" graphs of FIG. 3. The curves are the transfer characteristics of the two inverters 218 and 220 overlaid on top of each other under worst-case stability conditions. In general, for a given butterfly curve, the larger the area bounded by the two curves (302, 304), which may also be referred to as the "eyes" of the butterfly, the more stable the memory cell. This is quantified by the static noise margin (SNM)—defined as the side of the largest square that can be drawn in the "eye." As is apparent from FIGS. 3A and 3B, the exemplary 8-T memory cell of the present invention achieves a static noise margin that is more than twice the static noise margin of the standard 6-T memory cell design. This means that the 8-T cell can tolerate a much larger threshold voltage scatter and can thus be scaled to more aggressive technologies, in which we expect increased Vt variation and lower Vdd.

This improvement in static noise margin may be attributed to the fact that in the 8-T memory cell, the access transistors 214 and 216 are turned off during the read operation, thereby eliminating disturbs. The 8-T memory cell configuration is able to tolerate a significantly larger threshold voltage scatter, and can therefore be advantageously scaled to more aggressive integrated circuit (IC) process technologies in which an increased threshold voltage variation and/or lower supply voltage Vdd can be expected.

With regard to the layout of the 6-T memory cell in comparison to the exemplary 8-T memory cell 200, the 8-T memory cell generally consumes more area in the IC (e.g., about thirty percent more) due, at least in part, to the additional read circuit 226 and corresponding read bit line (RBL) 212 and read word line (RWL) 208 included in the memory cell, as shown in FIG. 2. Of course, the negative of the increased IC area is outweighed by the positive substantial increase in read stability provided by the 8-T memory cell architecture as shown in FIG. 2. Furthermore, depending on the specific application in which the memory cell is to be employed, the conventional 6-T memory cell design may simply not be suitable for use without significant modifications thereto. These modifications generally increase the size and/or complexity of the 6-T memory cell.

Figure 4:
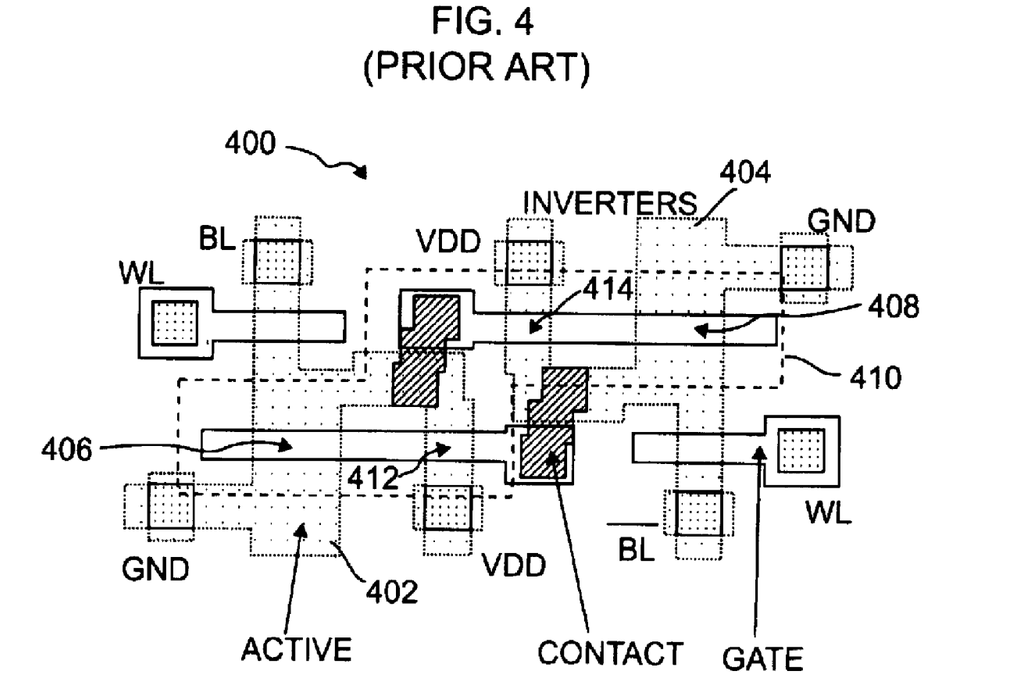
FIG. 4 shows an 8-T SRAM cell layout, indicating the placement of the inverters, according to another embodiment of the present invention.

FIG. 4 is a top plan view illustrating an exemplary IC layout 400 of the standard 6-T memory cell, according to the known art. Active areas 402 and 404 are generally drawn as arbitrary shapes. As apparent from the figure, the NMOS devices 406 and 408 in inverters 410 forming the static storage element are sized about twice as large as corresponding PMOS devices 412 and 414. This is done to help insure stability in the memory cell.

Figure 5:
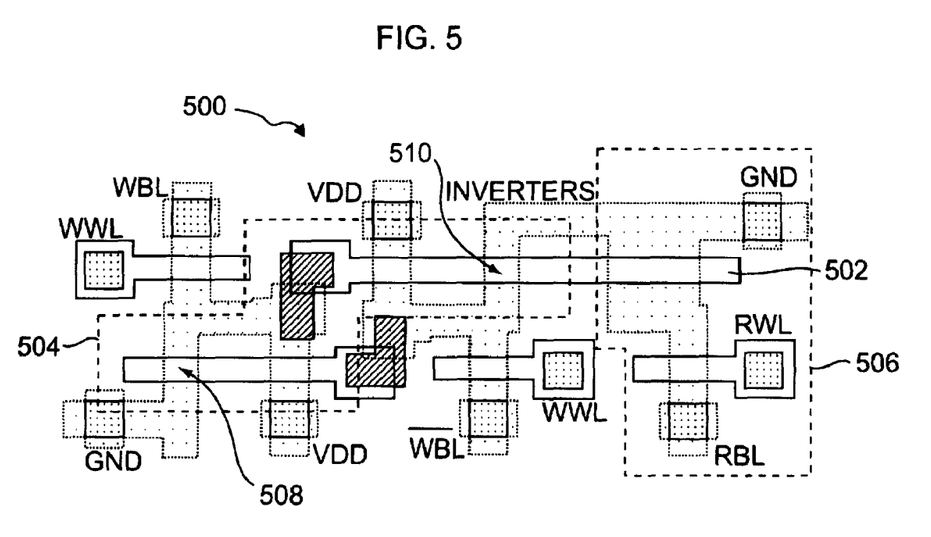
FIG. 5 shows an 8-T SRAM circuit diagram, indicating the different read and write mechanisms, according to an embodiment of the present invention.

By way of comparison, and without loss of generality, FIG. 5 is a top plan view illustrating at least a portion of an exemplary layout 500 of the 8-T memory cell 200 shown in FIG. 2, according to an embodiment of the present invention. Cell Layout. FIG. 5 illustrates the layout of the 8-T SRAM cell. This layout is achieved in a very area-efficient manner by lengthening the gate PC electrode 502 of one of the two inverters 504 in a standard 6-T SRAM cell (refer to FIG. 4) and then adding a series transistor 506 tied to the read word line (RWL) and read bit line (RBL). The transistor 506 may include two stacked NMOS transistors (see FIG. 2), without adding extra contacts.

In an 8T SRAM cell, two stacked transistors are added to create a method of reading the cell that is decoupled from the write mechanism. The extra word line and bit line also allow for dual-port operation, in which simultaneous read and write events can be performed in different cells of an array. A similar cell has been used in the past in multi-port register files; however, these cell layouts are very large (due to the transistor widths needed to drive large capacitive loads) and are not designed for stability.

In contrast, we implement an overall strategy to utilize the 8-T register file circuit for stable, high performance SRAM applications. Stability gains are expected to be as large as a factor of two. A dense cell layout similar to advanced 6-T cell designs can be achieved with only a 30% area penalty. Cell performance can be improved as the read and write mechanisms can be independently optimized for speed without affecting stability. Standard 6-T cells always present a tradeoff between performance and stability. Single-ended sense amplifiers can be used. These are more tolerant of process variations than current double-ended designs. As 6-T SRAM becomes difficult to scale due to stability problems caused by variability, 8-T SRAM can be used to continue scaling trends.

The basic idea behind the 8-T SRAM cell is that the read mechanism has been changed such that the stored voltage inside the cell is never disturbed. As shown in FIG. 2, two stacked transistors are added to create a method of reading the cell that is decoupled from the write mechanism. The extra word line and bit line also allow for dual-port operation, in which simultaneous read and write events could be performed in different cells of an array. As shown through the rest of the figures, we place the inverter FETs in a poly-SiON gate stack and all other FETs would be placed in metal Hi-k. Assuming the metal Hi-k has a band edge work functions, implants may be shared.

Just as with the 6-T cell, the new 8-T cell layout can be mirrored in a rolling fashion (up and down, left and right) to share all contacts across neighboring cells. The size of the pull-down NFET can also be reduced to minimum size (W) because the beta ratio of the cell (ratio of pull-down to pass-gate FET) no longer needs to be >2 to ensure stability of the cell. The layout is also compatible with a "Straight RX" cell design as shown in FIG. 6, which facilitates lithography.

Moreover, as apparent from FIG. 5, in the exemplary 8-T memory cell layout 500, the sizes of the NMOS devices 508, 510 in the inverters 504 can be reduced to minimum dimensions, like their corresponding PMOS devices, because the beta ratio of the cell (e.g., the ratio of the NMOS pull-down device to the pass-gate access transistor) is no longer required to be greater than about two to ensure the stability of the memory cell.

Figure 6:
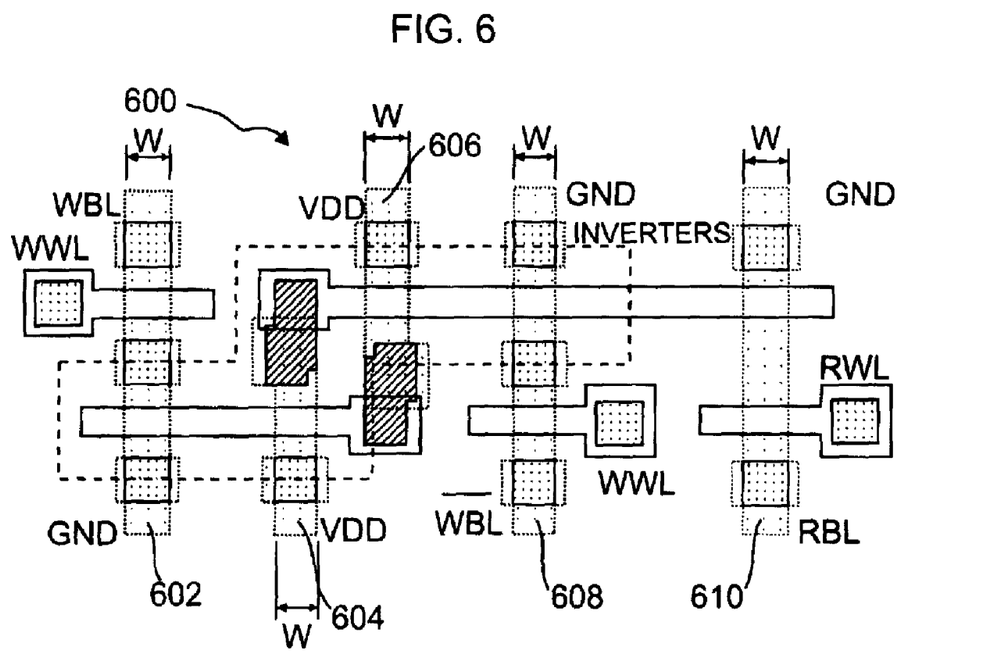
FIG. 6 is a top plan view depicting an exemplary layout of an 8-T memory cell, according to another embodiment of the present invention.

FIG. 6 is a top plan view depicting an exemplary layout 600 of the 8-T memory cell 200 shown in FIG. 2, in accordance with another embodiment of the invention. As apparent from the figure, the exemplary memory cell layout 600 comprises a plurality of active regions 602, 604, 606, 608 and 610, preferably formed on a substantially regular grating, with each active region preferably having substantially the same width W relative to one another. Moreover, spacing between any two adjacent active regions 602, 604, 606, 608 and 610 is preferably substantially the same. This layout technique, which may be referred to as a "straight RX" cell design, in addition to providing increased scalability of the memory cell, thereby improving a packing density thereof, facilitates the lithography process and improves device yield, thus reducing the overall cost of manufacturing the memory cell.

With reference again to FIG. 2, since, in the exemplary memory cell configuration of the present invention, the read and write mechanisms are isolated from one another, the circuitry employed for reading the memory cell 200, namely, read circuit 226, and the circuitry employed for writing to the memory cell 200, namely, write access circuits 228, 230, can be independently optimized relative to the storage element 202 and relative to one another. In accordance with an aspect of the invention, a strength of one or more transistor devices in the storage element 202 is preferably modified relative to a strength of one or more transistor devices in the read circuit 226 and/or write access circuits 228, 230. The strength of a given transistor device can be affected by many characteristics of the device, including, but not limited to, the device threshold voltage, oxide thickness, and/or channel width-to-length (W/L) ratio of the device, as will be apparent to those skilled in the art.

Improving 8-T Cell Performance, Power, and Stability. In the 8-T cell, because separate FETs are used for reading and writing, the two delays can be independently optimized. More importantly, strengthening the read or write access transistors (lower Vt, thinner $T_{ox}$, smaller $L_{gate}$, or larger W) does not impact stability. These devices can thus be designed as strong as possible (FIG. 7)—limited only by leakage power and layout area. Thus, the performance of the 8-T cell (read and write delays) can be much improved over 6-T cells.

Figure 7:
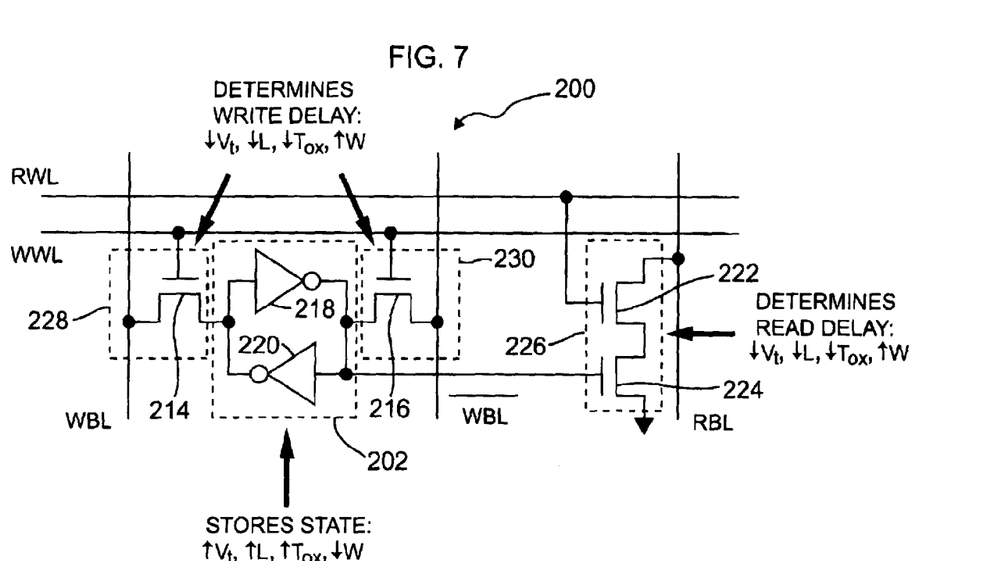
FIG. 7 is a schematic diagram illustrating an exemplary 8-T memory cell, according to another embodiment of the present invention.

While the 8-T cell circuit can already provide a significant improvement in cell stability, further stability enhancements can be achieved by appropriately designing the transistors in the inverters (FIG. 7). The inverters are used only to store state; if these devices are slow, there is no impact on the read delay and only a small (nearly negligible) impact on the write delay. As such, these devices can be designed to reduce power consumption and improve stability.

Using a high Vt, thick Tox, longer Lgate, and small W will reduce sub-threshold and gate leakage in the cell, thus minimizing standby power. The larger L and W reduce the impact of RX and PC linewidth variation, thus reducing Vt scatter. The higher $V_t$'s can further increase the static noise margin of the cell.

Architecture. Single-ended sense amplifiers are needed to read an 8-T SRAM cell because the read bit line is single-ended. The most basic design can be a "domino"-type inverter (essentially a dynamic inverter), which, functionally, is more tolerant of process-induced variations than traditional double-ended sense amplifiers based on cross-coupled inverters (very sensitive to Vt mismatch).

While the 8-T cell avoids read disturbs, write disturbs (during a write to another cell with a shared word line) are not addressed. This issue can instead be solved at the architectural level by the elimination of column select in that word lines will not be shared across cells that are in different words. This eliminates the column decoder and would require that entire words be written at the same time in the same spatial location. This could enhance multi-bit soft error fails, but can be dealt with by adding bits to the error correction codes (ECC).

FIG. 7 is a schematic diagram illustrating the exemplary 8-T memory cell 200 depicted in FIG. 2, including certain optimizations which can be made to further enhance the stability of the memory cell. As previously stated, the read and write mechanisms in exemplary memory cell 200 are essentially isolated from one another. Specifically, during a write operation, access transistors 214 and 216 in write access circuits 228 and 230, respectively, are enabled, and access transistors 222 and 224 in read circuit 226 are disabled. Likewise, during a read operation, transistors 222 and 224 are enabled and transistors 214, 216 are disabled. Ideally, it is desirable to make the write access transistors 214, 216 and read transistors 222, 224 as strong as possible and the transistors in storage element 202 as weak as possible. Unfortunately, however, in a 6-T memory cell arrangement, there is a tradeoff between stability and performance.

As will be understood by those skilled in the art, the speed of a given MOS device is generally a function of the strength of the device, and thus the stronger the device, the faster the device. Device strength is typically controlled as a function of one or more IC process characteristics, including, but not limited to, threshold voltage ($V_t$) and oxide thickness ($T_{ox}$), and one or more dimensional characteristics, such as, for example, channel length (L) and channel width (W) of the device. Typically, the strength (and thus the speed) of a device can be increased by decreasing the threshold voltage, by decreasing the channel length, by decreasing the oxide thickness, and/or by increasing the channel width.

Typically, a channel W/L ratio is specified for a given transistor device. By increasing the W/L ratio of the device, the strength of the device can be increased accordingly. Likewise, the strength (and thus the speed) of a device can be decreased by increasing the threshold voltage, by increasing the channel length, by increasing the oxide thickness, and/or by decreasing the channel width. Low-threshold voltage devices generally modify the shape of the butterfly curve associated with the memory cell by reducing the size of the eyes. Thus, using low-threshold devices typically results in a smaller SNM for the memory cell. Accordingly, in order to reduce the effect of disturbs during the read operation in the standard 6-T memory cell, all devices are typically high threshold voltage devices, which significantly increases a read and write delay of the memory cell.

As shown in FIG. 7, the exemplary 8-T memory cell 200 is preferably configured such that the write access transistors 214, 216 and the read transistors 222, 224 are made as strong as possible, limited essentially by leakage characteristics and/or layout area. Each of these devices may be strengthened, for example, by decreasing one or more of the threshold voltage, channel length and oxide thickness, and/or by decreasing the channel width of the device, as previously explained. Strengthening these devices does not impact memory cell stability, since disturbs during the read operation are substantially eliminated in the exemplary 8-T memory cell arrangement 200.

With regard to the static storage element 202 in the memory cell 200, the inverters 218, 220 can be optimized by making the transistor devices therein as weak (and thus as slow) as possible. Since the devices in storage element 202 are only used to store the logical state of the memory cell 200, making these devices slow will have virtually no impact on read delay (since the logical state of the cell is not being changed), and only negligible impact on write delay. Furthermore, weaker devices generally provide reduced leakage and increased noise margin compared to stronger devices, thereby reducing power consumption and improving the stability of the memory cell. Using devices having a high threshold voltage, thick oxide, longer channel length, and/or shorter channel width will reduce subthreshold and gate leakage, thereby reducing standby power consumption in the memory cell relative to conventional memory cell designs. Additionally, larger channel length devices can beneficially reduce the impact of line width variations, thereby reducing threshold voltage scatter commonly exhibited in standard memory cell architectures.

It is to be appreciated that while the memory cell architecture of the present invention can be employed to eliminate disturbs during the read operation of the memory cell, as previously explained, disturbs which may occur during the write operation of the memory cell are not addressed herein. This issue can instead be addressed in a higher architectural level of a memory array in which the memory cell may be implemented, for example, by elimination of column select circuitry typically included in the memory array.

In accordance with the techniques of the present invention, read disturbs are eliminated in a given memory cell by the addition of separate read circuitry, as previously explained. Write disturbs are preferably addressed in a higher architectural level of a memory array in which the given memory cell may be implemented. Column select capability, which is a primary source of write disturbs, are advantageously eliminated, as will be described below.

At least a portion of the memory cell and/or SRAM array of the present invention may be implemented in an integrated circuit. In forming integrated circuits, a plurality of identical dice are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Therefore, while there has been described what is presently considered to be the preferred embodiment, it will understood by those skilled in the art that other modifications can be made within the spirit of the invention. The above descriptions of embodiments are not intended to be exhaustive or limiting in scope. The embodiments, as described, were chosen in order to explain the principles of the invention, show its practical application, and enable those with ordinary skill in the art to understand how to make and use the invention. It should be understood that the invention is not limited to the embodiments described above, but rather should be interpreted within the full meaning and scope of the appended claims.

We claim:

1. A memory cell comprising:
an eight transistor SRAM cell comprising:
bit lines each comprising a read bit line and a write bit line;
word lines each comprising a read word line and a write word line;
a write circuit comprising:
a poly-SiON gate stack, the poly-SiON gate stack comprising a static storage element comprising a plurality of poly-SiON inverters, wherein the gate stack is electrically isolated from the bit lines and the word lines; and
at least one write access circuit coupled with the static storage element;
a read circuit decoupled from the write circuit, said read circuit coupled with a corresponding read bit line and read word line for selectively activating the read circuit, the read circuit comprising:
a metal Hi-k gate stack, coupled with the poly-SiON gate stack, the metal Hi-k gate stack comprising first and second metal Hi-k dielectric transistors connected in a stacked arrangement;
wherein a drain terminal of the first transistor is connected to the corresponding read bit line, and a source terminal of the first transistor is connected to a drain terminal of the second transistor;
wherein a source terminal of the second transistor is connected to a reference source;
wherein a gate terminal of the first transistor is connected to the read word line and forms a first input of the read circuit;
wherein a gate terminal of the second transistor is connected to an internal node of the static storage element and forms a second input of the read circuit; and
wherein the read circuit is configured such that a substantially low resistance electrical path is formed between the drain terminal of the first transistor and the source terminal of the second transistor when both the first and second inputs of the read circuit are enabled.

2. The memory cell of claim 1 wherein the memory cell is a static random access memory cell.

3. The memory cell of claim 2 further comprising alternative sensing circuitry connected to the read bit line, the alternative sensing circuitry operable to detect a voltage on the read bit line and to equate this voltage with a logical state of said memory cell.

4. The memory cell of claim 3 wherein the alternative sensing circuitry comprises a plurality of single-ended sense amplifiers.

5. The memory cell of claim 1 further comprising an external column decoder.

6. The memory cell of claim 1 wherein the reference source is ground.

7. The memory cell of claim 2 wherein the Poly-SiON inverters are used to store only a logical state of the memory cell.

8. The memory cell of claim 1 wherein said memory cell is mirrored in a rolling fashion to share all contacts across neighboring cells.

9. The memory cell of claim 1 wherein the read bit line is connected to the write bit line for reducing a number of bit lines required.

10. A static random access memory (SRAM) array comprising:
an eight transistor SRAM cell comprising:
a plurality of bit lines comprising read bit lines and write bit lines;
a plurality of word lines comprising read word lines and write word lines;
a plurality of memory cells, wherein at least one of the plurality of memory cells comprises:
a write circuit comprising:
a poly-SiON gate stack, the poly-SiON gate stack comprising a static storage element comprising a plurality of poly-SiON inverters, wherein the gate stack is electrically isolated from the plurality of bit lines and word lines; and
at least one write access circuit coupled with the static storage element; and
a read circuit decoupled from the write circuit, said read circuit coupled with a corresponding read bit line and a corresponding read word line for selectively activating the read circuit, the read circuit comprising:

a metal Hi-k gate stack, coupled with the poly-SiON gate stack, the metal Hi-k gate stack comprising first and second metal Hi-k dielectric transistors connected in a stacked arrangement.

11. The memory array of claim 10 wherein the at least one of the plurality of memory cells further comprises an alternative sensing circuitry connected to the corresponding read bit line, the alternative sensing circuitry operable to detect a voltage on said corresponding read bit line and to equate this voltage with a logical state of said memory cell.

12. The memory array of claim 11 wherein the alternative sensing circuitry comprises a plurality of single-ended sense amplifiers.

13. The memory array of claim 10 further comprising an external column decoder.

* * * * *